United States Patent
Yoshioka et al.

(10) Patent No.: US 7,291,922 B2
(45) Date of Patent: Nov. 6, 2007

(54) SUBSTRATE WITH MANY VIA CONTACT MEANS DISPOSED THEREIN

(75) Inventors: Hokichi Yoshioka, Tokyo (JP); Kazuhiko Ito, Tokyo (JP)

(73) Assignee: Tecnisco Ltd., Tokyo (JP)

( * ) Notice: Subject to any disclaimer, the term of this patent is extended or adjusted under 35 U.S.C. 154(b) by 144 days.

(21) Appl. No.: 11/207,715

(22) Filed: Aug. 22, 2005

(65) Prior Publication Data

US 2006/0038288 A1   Feb. 23, 2006

(30) Foreign Application Priority Data

Aug. 23, 2004   (JP)   ............... 2004-242168

(51) Int. Cl.
*H01L 23/48*   (2006.01)
(52) U.S. Cl. ............ 257/774; 257/702; 257/779; 257/E23.146
(58) Field of Classification Search ........ 257/702, 257/774, 779; 29/852, 828
See application file for complete search history.

(56) References Cited

U.S. PATENT DOCUMENTS 5,972,734 A * 10/1999 Carichner et al. ......... 438/106
7,024,763 B2 * 4/2006 Mathieu et al. ............ 29/837
2002/0157247 A1 * 10/2002 Li .............................. 29/840
2004/0173891 A1 * 9/2004 Imai et al. .................. 257/686

FOREIGN PATENT DOCUMENTS

JP   2002-174742   6/2002

OTHER PUBLICATIONS

"Chip on Board for Multichip Modules" by John H. Lau, Published by Chapman and Hall, NY, 1994.*

* cited by examiner

*Primary Examiner*—Nitin Parekh
(74) *Attorney, Agent, or Firm*—Smith, Gambrell & Russell, LLP

(57) ABSTRACT

A substrate having many via contact means disposed therein. Each of the via contact means is composed of a via hole, as a through-hole, formed in the substrate, a metal film disposed on the inner peripheral surface of the via hole, and a solder filled into the cavity defined by the metal film.

11 Claims, 2 Drawing Sheets

SUBSTRATE WITH MANY VIA CONTACT MEANS DISPOSED THEREIN

FIELD OF THE INVENTION

This invention relates to, although not limited to, a substrate having many via contact means disposed therein, the substrate being particularly suitable for stacking as a protective substrate on the face of a wafer where many devices, such as micromachines, are disposed.

DESCRIPTION OF THE PRIOR ART

It is well known among those skilled in the art that semiconductor devices, such as micromachines, are produced by disposing many semiconductor devices on the face of a semiconductor wafer such as a silicon wafer, then stacking a protective substrate on the face of the wafer, and then dicing the semiconductor wafer and the protective substrate to form individual devices. In the protective substrate, via contact means are disposed in correspondence with a plurality of electrodes in each of the devices. Each of the via contact means is composed of a via hole, as a through-hole, formed in the protective substrate, and an electrically conductive material filled into the via hole. Normally, the electrically conductive material is plated copper, nickel or gold.

A ceramic substrate has generally been used as the protective substrate. As disclosed in Japanese Patent Application Laid-Open No. 2002-174742, however, proposals have been made for the use of a glass substrate instead of a ceramic substrate, for example, for the following reasons: If it is necessary to irradiate the device with light or emit light from the device, the protective substrate needs to be transparent. If the wafer is silicon, the glass substrate can be stacked thereon by so-called electrostatic coupling, without the use of an adhesive.

According to the inventors' experience, however, it has been found that the conventional substrate having many via contact means disposed therein poses the following problems to be solved: First, it is not easy to fill the via holes, formed in the substrate, with an adequate amount of a plated metal such as copper, nickel or gold, and thus voids tend to be formed in the plated metal in the via holes. The presence of the voids in the plated metal results in the entry of the outside air through these voids, deteriorating the function of the devices. Secondly, particularly in the case of a glass substrate, the thermal expansion coefficient of the plated metal in the via holes and the thermal expansion coefficient of the substrate differ markedly. As a result, the substrate, if subjected to temperature changes, may be damaged, or gaps may be generated between the inner peripheral surfaces of the via holes and the plated metal.

SUMMARY OF THE INVENTION

It is a principal object of the present invention, therefore, to provide a novel and improved substrate in which via holes formed in the substrate can be filled with an electrically conductive material reliably and sufficiently easily without involving any voids.

In is another object of the present invention, in addition to the attainment of the principal object, to provide a novel and improved substrate which, even when made of glass, is not damaged upon exposure to temperature changes, and in which no gaps are produced between the via holes and the electrically conductive material filling the via holes.

We, the inventors, diligently conducted studies and have found that the above principal object can be attained by working out a configuration in which a metal film is disposed on the inner peripheral surface of each of via holes formed in a substrate, and a solder is filled into a cavity defined by the metal film.

That is, according to the present invention, as a substrate for attaining the above principal object, there is provided a substrate having many via contact means disposed therein, and wherein each of the via contact means is composed of a via hole, as a through-hole, formed in the substrate, a metal film disposed on the inner peripheral surface of the via hole, and a solder filled into a cavity defined by the metal film.

The substrate is advantageously made of glass, especially, borosilicate glass. The other object of the present invention is attained by rendering the thermal expansion coefficient of the metal film lower than the thermal expansion coefficient of the solder.

Preferably, the metal film is made of chromium or titanium, and is disposed by vapor deposition or sputtering. The solder is preferably a silver solder. It is preferred that a metallic intervening film, which may be made of plated copper, be disposed on the inner peripheral surface of the metal film. At the center of the cavity defined by the metal film, a metallic core member is preferably arranged. The core member may be made of an alloy containing iron, nickel and cobalt. The core member is preferably cylindrical.

DETAILED DESCRIPTION OF THE PREFERRED EMBODIMENTS

Preferred embodiments of a substrate constructed in accordance with the present invention will now be described in detail by reference to the accompanying drawings.

Figure 1:
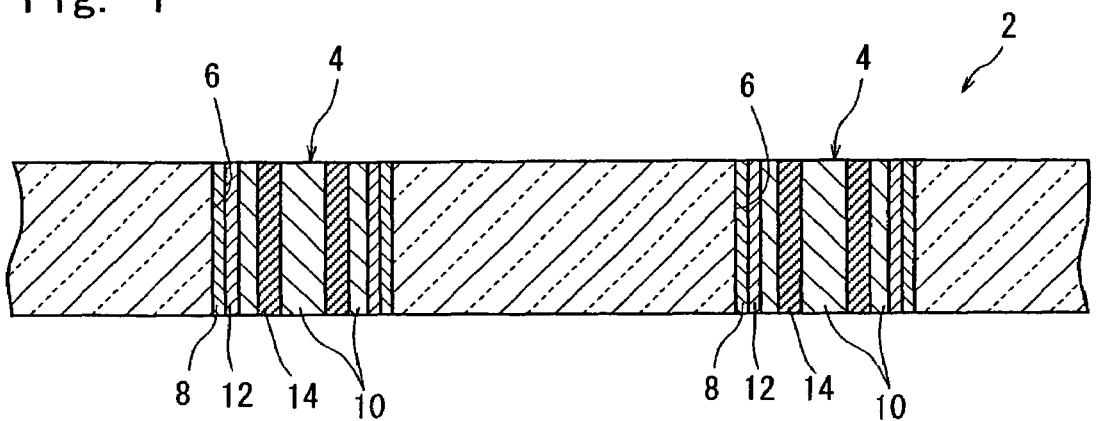
FIG. 1 is a sectional view showing a part of a substrate constructed in accordance with the present invention.

FIG. 1 shows a preferred embodiment of a substrate constructed in accordance with the present invention. The substrate, indicated entirely at the numeral 2, has a shape corresponding to the shape of a wafer (not shown), on which the substrate is to be stacked, for example, a disk shape. Preferably, the substrate 2 is made of glass, especially, borosilicate glass (for example, borosilicate glass marketed under the trade name "Pyrex"). If the substrate 2 is formed of borosilicate glass, the thickness of the substrate 2 may be of the order of 0.2 to 0.6 mm.

In the substrate 2, many via contact means 4 are disposed in correspondence with electrodes of semiconductor devices disposed on the face of the wafer on which the substrate 2 is to be stacked. (In FIG. 1, only two of the via contact means 4 are shown.) Each of the via contact means 4 includes a via hole 6, as a through-hole, formed in the substrate 2. The via hole 6 extends substantially perpendicularly to the face and back of the substrate 2. The inner diameter of the via hole 6 may be of the order of 0.1 to 0.4 mm.

A metal film 8 is disposed on the inner peripheral surface of the via hole 6. The metal film 8 preferably has a thermal expansion coefficient which is higher than the thermal expansion coefficient of the substrate 2, but lower than the thermal expansion coefficient of a solder to be described later. The difference between the thermal expansion coefficient of the substrate 2 and the thermal expansion coefficient of the metal film 8 is preferably 5 ppm/K or less. If the substrate 2 is formed of borosilicate glass (its thermal expansion coefficient is 3.3 ppm/K), the metal film 8 is preferably formed of chromium (its thermal expansion coefficient is 6.8 ppm/K) or titanium (its thermal expansion coefficient is 8.4 ppm/K). The thickness of the metal film 8 may be of the order of μm. Such a metal film 8 can be disposed by vapor deposition or sputtering, as will be further mentioned later.

It is important that a solder 10 be filled into the cavity defined by the metal film 8. In the illustrated embodiment, a metallic intervening film 12 is disposed on the inner peripheral surface of the metal film 8, and a metallic core member 14 is disposed at the center of the cavity defined by the metal film 8. The core member 14 is cylindrical, and its length is substantially the same as the thickness of the substrate 2. The outer diameter of the core member 14 may be of the order of 0.09 mm, and the inner diameter of the core member 14 may be of the order of 0.04 mm. The solder 10 is filled between the inner peripheral surface of the intervening film 12 and the outer peripheral surface of the core member 14, and is also filled inside the core member 14. The intervening film 12 is preferably formed of copper, especially, oxygen-free copper (its thermal expansion coefficient is 16.5 ppm/K), having a thickness of the order of 0.1 μm and, as will be further mentioned later, can be disposed by plating. The core member 14 is preferably made of a metal having a thermal expansion coefficient close to the thermal expansion coefficient of the substrate 2, for example, an alloy containing iron, nickel and cobalt (for example, an alloy marketed under the trade name "Kovar", and having a thermal expansion coefficient of 5.3 ppm/K). If the inner diameter of the via hole 6 is small, in particular, the core member 14, which is round columnar rather than cylindrical, can be used, or the core member 14 can be omitted. The solder 10 is preferably a silver solder (its thermal expansion coefficient is 21 ppm/K).

Figure 2:
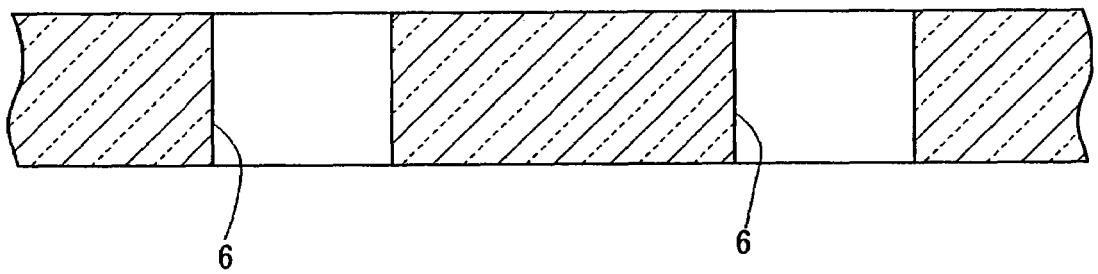
FIG. 2 to FIG. 6 are sectional views for illustrating the manner of production of the substrate shown in FIG. 1.

Next, an explanation will be offered for an example of the manner of production of the above-described substrate 2. First, as shown in FIG. 2, the via hole 6 is bored at a required position of the substrate 2 which is advantageously borosilicate glass. This boring can be performed advantageously by use of an electroformed drill containing diamond abrasive grains.

Figure 3:
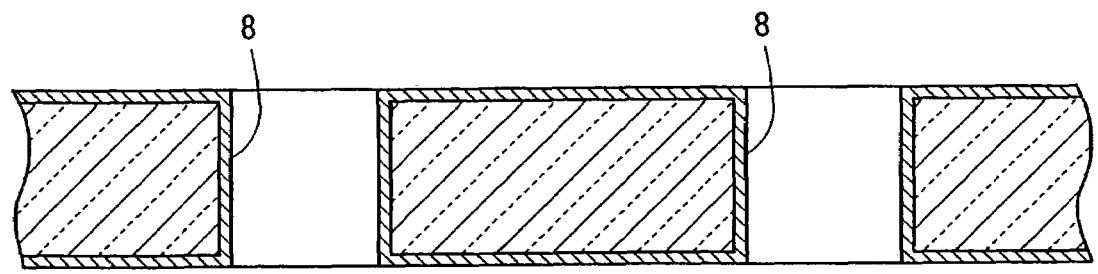

Then, as shown in FIG. 3, the metal film 8 of the order of 0.1 μm thick is disposed on the inner peripheral surface of the via hole 6 as well as on the upper surface and lower surface of the substrate 2. The metal film 8 preferably made of chromium or titanium can be formed by vapor deposition or sputtering.

Figure 4:
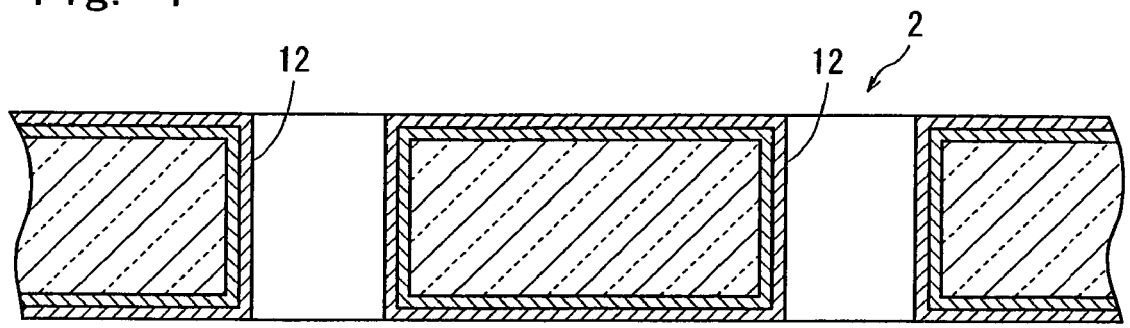

Then, as shown in FIG. 4, the intervening film 12 of the order of 0.1 μm thick is formed on the surface of the metal film 8 (thus, on the inner peripheral surface of the via hole 6 as well as on the upper surface and lower surface of the substrate 2). The intervening film 12 preferably made of oxygen-free copper can be advantageously formed by plating.

Figure 5:
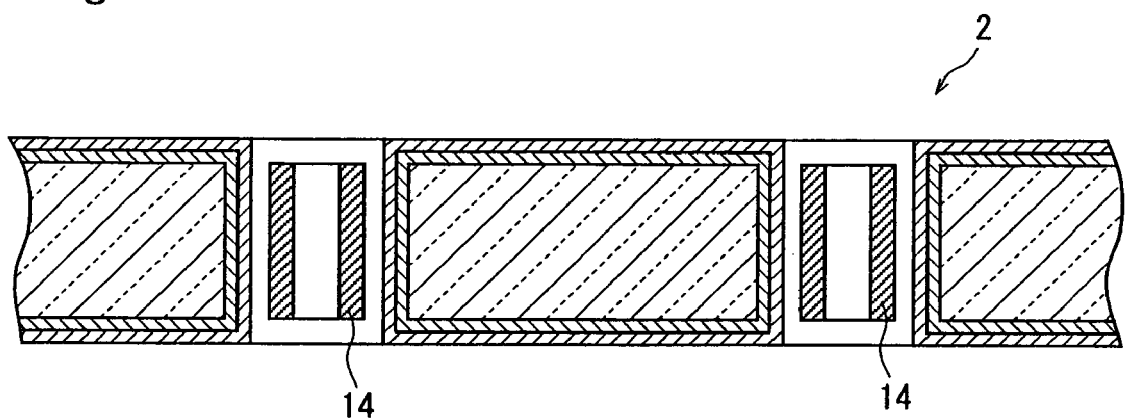
Figure 6:
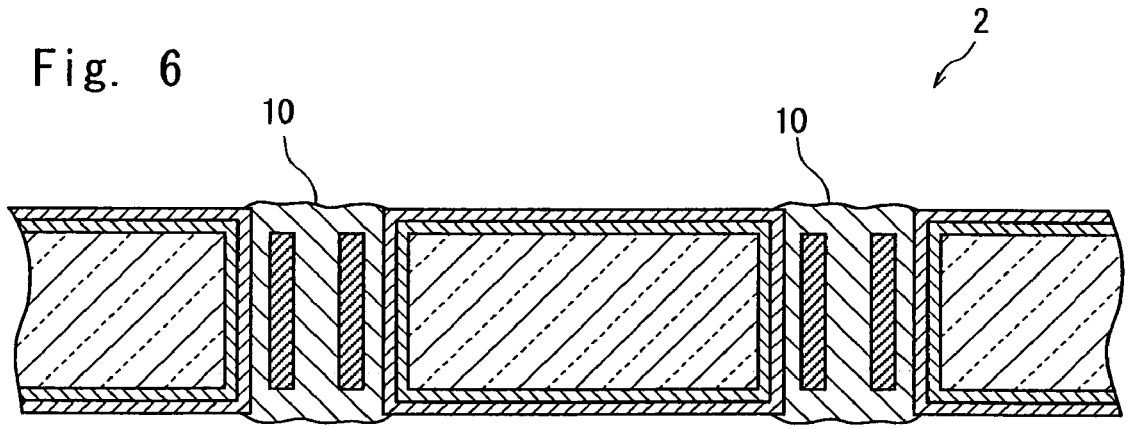

Then, as shown in FIG. 5, the core member 14 is arranged at a central portion of the via hole 6. Then, as shown in FIG. 6, the solder 10 in softened state is charged into the space present in the via hole, namely, the space between the intervening film 12 and the outer peripheral surface of the core member 14 and the space within the core member 14, to fill this space with the solder 10. The solder 10, which is advantageously a silver solder, is cooled and solidified. The joining characteristics between the silver solder and the oxygen-free copper are sufficiently satisfactory, so that the solidified solder 10 is joined to the intervening film 12 sufficiently satisfactorily.

Then, the upper surface and lower surface of the substrate 2 are ground to remove the metal film 8, the intervening film 12 and the solder 10 present on the upper surface and lower surface of the substrate 2, thereby rendering the upper surface and lower surface of the substrate 2 itself exposed. In this manner, the substrate 2 having the many via contact means 4 disposed therein is achieved.

In the substrate 2 that can be formed in the foregoing manner, the via holes 6 can be filled with the solder 10 sufficiently easily, and the generation of voids in the via holes 6 can be avoided sufficiently reliably. Moreover, the intervening film 12 having a thermal expansion coefficient lower than the thermal expansion coefficient of the solder 10, but higher than the thermal expansion coefficient of the metal film 8, and the metal film 8 having a thermal expansion coefficient lower than the thermal expansion coefficient of the intervening film 12, but higher than the thermal expansion coefficient of the substrate 2 are present between the solder 10 and the substrate 2. Hence, the substrate 2 is not damaged even upon exposure to relatively great changes in temperature. Furthermore, the solder 10 is joined to the intervening film 12 sufficiently firmly, the intervening film 12 is strongly bonded to the metal film 8, and the metal film 8 is tightly connected to the substrate 2. Thus, no clearances are generated between the solder 10 and the intervening film 12, between the intervening film 12 and the metal film 8, or between the metal film 8 and the substrate 2. Besides, the joining characteristics between the core member 14 and the solder 10 are also sufficiently satisfactory. Therefore, no gaps are formed between the core member 14 and the solder 10.

While the preferred embodiments of the substrate constructed according to the present invention have been described in detail by reference to the accompanying drawings, it is to be understood that the invention is not limited to such embodiments, but various changes and modifications may be made without departing from the scope of the invention.

We claim:

1. A substrate having many via contact means disposed therein, and wherein each of the via contact means is composed of a via hole, as a through-hole, formed in the substrate, a metal film disposed on an inner peripheral surface of the via hole, and a solder filled into a cavity defined by the metal film, wherein a metallic core member is arranged at a center of the cavity defined by the metal film.

2. The substrate according to claim 1, wherein the substrate is made of glass.

3. The substrate according to claim 2, wherein the substrate is made of borosilicate glass.

4. The substrate according to claim 1, wherein a thermal expansion coefficient of the metal film is lower than a thermal expansion coefficient of the solder.

5. The substrate according to claim 1, wherein the metal film is made of chromium or titanium.

6. The substrate according to claim 5, wherein the metal film is disposed by vapor deposition or sputtering.

7. The substrate according to claim 1, wherein the solder is a silver solder.

8. The substrate according to claim 1, wherein a metallic intervening film is disposed on an inner peripheral surface of the metal film.

9. The substrate according to claim 8, wherein the intervening film is composed of copper plated on the inner peripheral surface of the metal film.

10. The substrate according to claim 1, wherein the core member is made of an alloy containing iron, nickel and cobalt.

11. The substrate according to claim 1, wherein the core member is cylindrical.

* * * * *